(12) United States Patent
Martens et al.

(10) Patent No.: US 7,545,151 B2
(45) Date of Patent: Jun. 9, 2009

(54) CHARACTERIZING TEST FIXTURES

(75) Inventors: Jon S. Martens, San Jose, CA (US); David V. Judge, Peterbourgh, NH (US)

(73) Assignee: Anritsu Company, Morgan Hill, CA (US)

( * ) Notice: Subject to any disclaimer, the term of this patent is extended or adjusted under 35 U.S.C. 154(b) by 230 days.

(21) Appl. No.: 11/738,265

(22) Filed: Apr. 20, 2007

(65) Prior Publication Data
US 2008/0258738 A1   Oct. 23, 2008

(51) Int. Cl.
*G01R 27/28* (2006.01)
*G01R 35/00* (2006.01)

(52) U.S. Cl. .......................... 324/601; 324/650; 702/85

(58) Field of Classification Search ................. 324/601, 324/650; 702/85
See application file for complete search history.

(56) References Cited

U.S. PATENT DOCUMENTS

| | | | |
|---|---|---|---|
| 5,578,932 A | 11/1996 | Adamian | |
| 5,748,506 A | 5/1998 | Bockelman | |
| 5,784,299 A | 7/1998 | Evers et al. | |
| 6,188,968 B1 | 2/2001 | Blackham | |
| 6,300,775 B1 | 10/2001 | Peach et al. | |
| 6,643,597 B1 * | 11/2003 | Dunsmore | 702/104 |
| 6,653,848 B2 | 11/2003 | Adamian et al. | |
| 6,665,628 B2 | 12/2003 | Martens | |
| 2002/0080446 A1 | 6/2002 | Derventzis et al. | |
| 2004/0201383 A1 * | 10/2004 | Anderson | 324/600 |

OTHER PUBLICATIONS

"Network Analyser Calibration", www.morph/demon.co.uk/Electronics/new.htm (visited Nov. 13, 2001), 12 pages.
Agilent Application Note 1364-1, "De-embedding and Embedding S-Parameter Networks Using a Vector Network Analyzer," Agilent (May 30, 2004), pp. 1-24.
Agilent Product Note 8510-13, "Measuring Noninsertable Devices," Agilent Technologies, (Aug. 1988), 15 pages.
Anritsu Model 360B Vector Network Analyzer, Operation Manual, Revision: F (Oct. 1997), Chapters 3, 4, 5, 6, 7, 8 and 9, pp. 3-4 to 9-46.
Anritsu Application Note "Embedding/De-embeding,"(May 2002), pp. 1-16.

(Continued)

*Primary Examiner*—Vincent Q Nguyen
(74) *Attorney, Agent, or Firm*—Fliesler Meyer LLP

(57) ABSTRACT

Provided herein are techniques for characterizing a test fixture that is used for connecting a device under test (DUT) to a vector network analyzer (VNA), e.g., to thereby enable de-embedding of the test fixture from measurements of the DUT connected to the test fixture. In an embodiment, the test fixture is separated into 4-port test fixture segments, based on which ports of the DUT have internal coupling. Each test fixture segment has an outer 2-port reference plane and an inner 2-port reference plane. A 4-port calibration is performed at outer planes of the two test fixture segments, while corresponding ports of the inner planes of the test fixture segments are connected together with thru segments, to thereby determine a thru set of S-parameters. A set of S-parameters is determined for each of the 4-port test fixture segments, based on the thru set of S-parameters.

14 Claims, 9 Drawing Sheets

OTHER PUBLICATIONS

Anritsu Application Note "Reflectometer Measurements—Revisited," (Apr. 2000), Rev. C, 12 pages.

Bauer, R.F., Penfield, Jr., P., "De-Embedding and Unterminating", IEEE Transactions Of Microwave Theory and Technique, vol. MTT-22, No. 3 (Mar. 1974), pp. 282-288.

Björck and Hammarling, "A Schur method for the square root of a matrix," Linear Algebra Appl. 52/53 (1983) 127-140.

Collin, R.E., Foundations for Microwave Engineering, McGraw-Hill (1966), Chapter 6 entitled "Passive Microwave Devices", pp. 259-312.

Daywitt, W.C., "Determining Adapter Efficiency by Envelope Averaging Swept Frequency Reflection Data", IEEE Transactions on Microwave Theory and Techniques, vol. 38, No. 11 (Nov. 1990), pp. 1748-1752.

Eberly, M., Dunleavy, L., "Intro to the Agilent 8714—RF Network Analyzer", Agilent Technologies, EducatorsCorner.com Experiments, 7 pages,http://www.home.agilent.com/upload/cmc_upload/All/exp84.pdf (visited Jul. 24, 2007).

Edwards, M.L., "Calibration and Measurements of S-Parameters", Microwave & RF Circuits: Analysis, Design, Fabrication & Measurement, Chapter 7 (Sep. 7, 2001), 23 pages.

Fay, P. "Error Correction For Network Analysis-Lab #5", Microwave Circuit Design and Measurements Lab, EE 458/558 (Revised Sep. 2001), 3 pages.

Glasser, L.A., "An Analysis of Microwave De-embedding Errors", IEEE Transactions on Microwave Theory and Techniques, vol. NTT-26, No. 5 (May 1978), pp. 379-380.

Gonzalez, Ph.D., G., Microwave Transistor Amplifiers Analysis and Design, Prentice-Hall, Inc., New Jersey (Aug. 1996), Chapters 1 and 2, pp. 1-90.

King and Biron, "Direct Characterization of Non-Insertable Microwave Test Fixtures For Packaged MMICs"; 57.sup.thARFTG Dig (May 2001), pp. 19-27.

Matthew and Song, "RF Impedance Measurement Calibration, Advances Photon Source," Argonne National Laboratory (Feb. 12, 1993), 16 pages, www.aps.anl.gov/techpub/lsnotes/Is223/Is223.html (visited Nov. 12, 2001).

Nelson, R., "What are S-parameters, anyway?", Test & Measurement World,, 9 pages, http://www.tmworld.com/article/CA187307.html, (Feb. 1, 2001).

Pollard, R.D., Lane, R.Q., "The Calibration Of A Universal Test Fixture," IEEE MIT-S Digest, pp. 498-500 (1983).

Randa, J.I., Wiatr W., Billinger, R., "Comparison of Adapter Characterization Methods," IEEE Trans. on MTT, vol. 47 (Dec. 1999), pp. 2613-2620.

Silvonen, K., "Calibration and De-Embedding of Microwave Measurements Using Any Combination of One-or Two-port Standards," Circuit Theory Laboratory CT-4 (Dec. 1987), Helsinki University of Technology, 28 pages.

Tippet, J.C.,; Speciale, R.A., "A Rigorous Technique for Measuring the Scatter Matrix of a Multiport Device with a 2-Port Network Analyzer," IEEE Transactions on Microwave Theory and Techniques, vol. MIT-20, No. 5 (May 1992), pp. 661-666.

Vaitkus and Scheitlin, A Two-Tier Deembedding Technique For Packaged Transistors, IEEE-S Digest, pp. 328-330 (1982).

Wiatr, W., "A Method for Embedding Network Characterization with Application to Low-loss Measurements," IEEE Transactions On Instruments and Measurements, vol. 36 (Jun. 1987), pp. 487-490.

D. F. Williams and D. K. Walker, "In-Line Multiport Calibration," 51st ARFTG Conference Digest, pp. 88-90 (Jun. 12, 1998).

Wiltron/Anritsu Company documentation for the 360B and 37xxx network analyzers, pp. 8-34 to 8-38.

"Circulators and Diplexers," http://www.rfcafe.com/references/electrical/circulators.htm, 3 pages (Mar. 5, 2002).

* cited by examiner

CHARACTERIZING TEST FIXTURES

FIELD OF THE INVENTION

The present invention relates to techniques for characterizing a test fixture that is used to connect a device under test (DUT) to a vector network analyzer (VNA), e.g., so that the test fixture can be de-embedded from measurements of the DUT connected to the test fixture.

BACKGROUND

Measurements of a device under test (DUT) using a VNA may not always be performed in a desired test environment. This is because it may be too time intensive and/or costly to measure a DUT in a desired test environment. Accordingly, a DUT is often measured in a different environment for reasons of expediency and/or practicality, thereby requiring the use of embedding or de-embedding techniques to correct the effects of the test environment. For example, a DUT may be in a test fixture when measurements of the DUT are made, thereby requiring the removal of the effects of the fixture from the measured data for a truer picture of actual DUT performance. De-embedding techniques allows this task (i.e., removal of effects) to be performed computationally. In another example, a customer may desire to see what the performance of a DUT would be with a specific matching network attached. However it may be impractical to attach the matching network during manufacturing for cost reasons. Embedding techniques allow this task (i.e., attaching the matching network) to be performed computationally.

In an ideal de-embedding problem, a test fixture to be de-embedded can be characterized by placing multiple calibration standards at input and output planes of the fixture. In practice, this is often difficult due to the nature of the media at one or more interfaces (e.g., a launch onto a PC board). This problem is compounded in multiport problems in that there may be intra-port coupling that needs to be taken into account.

As just explained, a structure to be de-embedded can be a test fixture surrounding a multiport DUT. The classical approach has been to treat all ports of the fixture as uncoupled, in which case standard two port de-embedding techniques may be used, as explained with reference to FIG. 1. In the classic approach, the path from each fixture port to the DUT is treated as an independent two port network, also referred to as a fixture part. This can be appreciated from FIG. 1, which schematically shows a 4-port DUT 102 connected to four fixture parts $104_1$, $104_2$, $104_3$ and $104_4$. Typically, three or more reflect standards (also known as calibration standards) would be connected at the DUT plane 107 for each fixture part $104_n$. From this, the S-parameters of each fixture part can be deduced. This could require a fair amount of standards development, which could be difficult depending on the media near the DUT. Also, this may require a reciprocity assumption about the fixture, as explained in an article by R. Bauer and P. Penfield, entitled "De-embedding and Unterminating," IEEE Trans. On MTT, vol. MTT-22, March 1974, pp. 282-288, which is incorporated herein by reference.

Still using the two port construct, one could try to just use a thru pair standard, which connect fixture part $104_1$ to fixture part $104_3$, and connects fixture part $104_2$ to fixture part $104_4$. Additional assumptions must be made in this case, including: most mismatch concentrated near the external launch point and reasonably well-matched overall; and well-matched at the DUT interface planes.

However, if the ports of the fixture have any coupling (i.e., if fixture parts are coupled), this procedure breaks down since the de-embedding must be treated as a 4 (or more) port network, instead of a 2 port network. Thus, even if the assumptions stated above can be met, there will be accuracy issues due to the mishandling of coupling.

A complete solution to the problem would be a variant on extraction, which is explained, e.g., for example, in Anritsu Application Note 11410-000278, entitled "Embedding/De-embedding," May 2002, pp. 12-13. In this technique, a full N-port calibration is accomplished at the inner planes of the fixture as well as the outer planes. This can be explained with reference to FIG. 2.

Referring to FIG. 2, a DUT 202 is shown surrounded by a fixture 200. Here, two full calibrations can be performed, one using a outer calibration plane 206, and one using an inner calibration plane 207, which allows S-parameters of the fixture to be extracted. Using this technique some port coupling within the fixture 200 is allowed, but caution is required.

This full extraction process, can however, be troublesome in that a full set of calibration standards must be developed at the inner plane 207. This can be expensive and may have accuracy problems since the media at the inner planes may not be well characterized. The number of standards used may be dependent on the level of intra-fixture coupling that one is trying to extract and convergence issues can arise at very high coupling levels.

Accordingly, there is still a need for an extraction procedure that can handle some level of port coupling within the fixture, require a minimum of standards development at the inner plane, and still remove the fixture effects with reasonable accuracy.

SUMMARY

Specific embodiments of the present invention are related to systems and methods for characterizing a test fixture that is used for connecting four ports a device under test (DUT) to a vector network analyzer (VNA), e.g., to thereby enable de-embedding of the test fixture from measurements of the DUT connected to the test fixture. In accordance with an embodiment, the test fixture is separated into two 4-port test fixture segments, based on which ports of the DUT have internal coupling. Each test fixture segment has an outer 2-port reference plane and an inner 2-port reference plane. A 4-port calibration is performed at outer planes of the two test fixture segments, while corresponding ports of the inner planes of the test fixture segments are connected together with thru segments, to thereby determine a "thru" set of S-parameters $(S_{mn}^{thru})$. A set of S-parameters $(S_{mn}^{fixture\_1}$ and $S_{mn}^{fixture\_2})$ is determined for each of the two 4-port test fixture segments, based on the thru set of S-parameters $(S_{mn}^{thru})$. This can be efficiently accomplished, using various reasonable assumptions. The sets of S-parameters can then be used for de-embedding of the test fixture from measurements of the DUT connected to the test fixture. For example, such information can be stored as de-embedding files (e.g., s4p files), which can be used in a de-embedding algorithm.

Embodiments of the present invention can also be used to characterize a test fixture that is used for connecting only 2 ports of a DUT to a VNA. This would be useful where a fixture being used to measure S-parameters of a 2-port DUT, or to measures S-parameters of 2 ports of a DUT having more than 2 ports (e.g., where only 2 ports have coupling). More generally, specific embodiments of the present invention can be used to characterize a test fixture that is used for connecting 2 ports of DUT to a VNA, to thereby enable de-embedding of the test fixture from measurements of the DUT connected to the test fixture. Such embodiments are similar to those just described above, but only one test fixture segment need be characterized.

Embodiments of the present invention can also be used to characterize a test fixture that is used for connecting a DUT having more than 4 ports to a VNA. In such embodiments, the test fixture is separated into multiple 4-port test fixture segments, based on which ports of the DUT have internal coupling, wherein each test fixture segment has an outer 2-port reference plane and an inner 2-port reference plane. A 4-port calibration is performed at outer planes of a pair of the test fixture segments, while corresponding ports of the inner planes of the pair of test fixture segments are connected together with thru segments, to thereby determine a thru set of S-parameters (S $S_{mn}^{thru\_x}$). The calibration process is repeated for further pairs of the test fixture segments, until all of the test fixtures segments are part of a 4-port calibration. Each time the calibration is repeated, another thru set of S-parameters is determined. A set of S-parameters ($S_{mn}^{fixture\_y}$) is then determined for each of the multiple 4-port test fixture segments, based on the thru sets of S-parameters determined from the calibrations.

Further embodiments, and the features, aspects, and advantages of the present invention will become more apparent from the disclosure set forth below.

BRIEF DESCRIPTION OF THE DRAWINGS

FIG. 8 shows measured S-parameters for one of the test fixture segments shown in FIGS. 3B and 3C.

DETAILED DESCRIPTION

Figure 1:
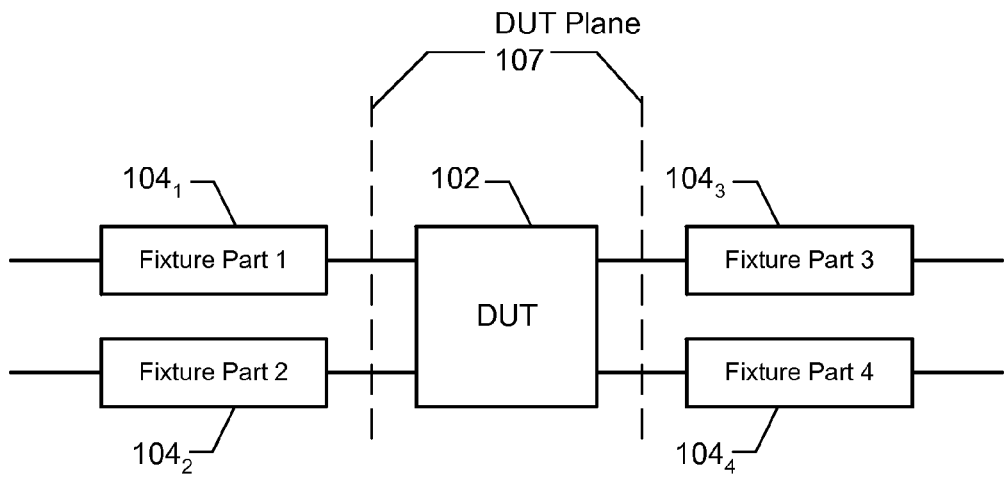
FIG. 1 illustrates how each path from each fixture port to the 4-port DUT can be treated as an independent two port network (also referred to as a fixture part).
Figure 2:
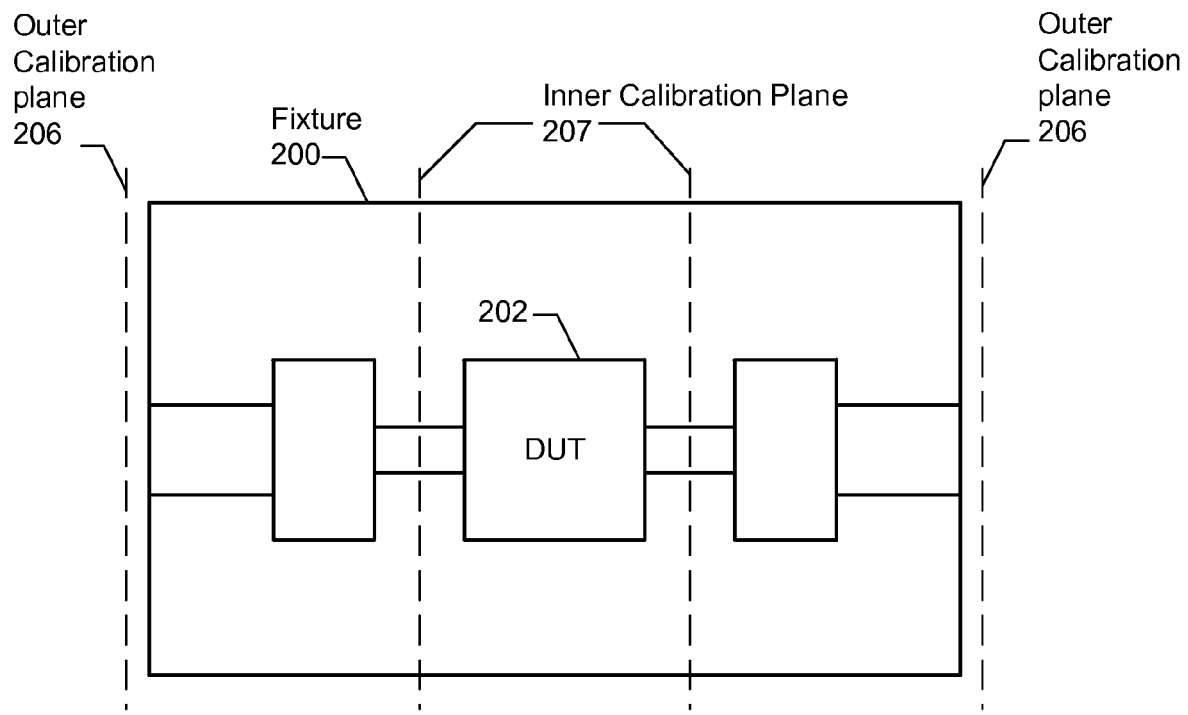
FIG. 2 illustrates two calibration planes that exist when a 4-port DUT is connected to a test fixture.
Figure 3A:
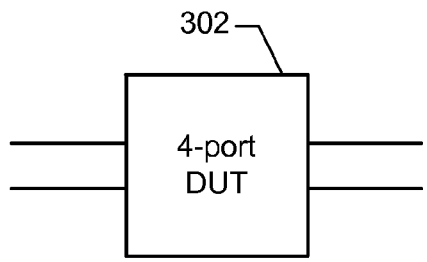
FIG. 3A illustrates a schematic representation of an exemplary 4-port DUT.

Embodiments of the present invention are directed to techniques for characterizing a test fixture that is used for connecting a device under test (DUT) to a vector network analyzer (VNA), to thereby enable de-embedding of the test fixture from measurements of the DUT connected to the test fixture. FIG. 3A illustrates a schematic representation of an exemplary 4-port DUT.

Specific embodiments discussed herein enable the construction of 4-port networks, i.e., treating fixture ports on a pairing basis to account for weak coupling. This enables de-embedding of multiport fixtures using a single thru calibration measurement and some assumptions about the match behavior in parts of the network.

Figure 3B:
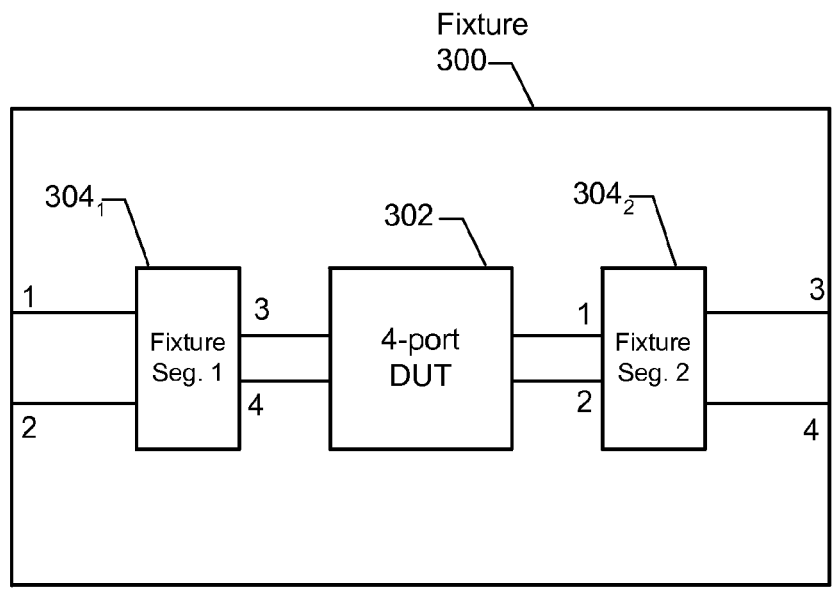
FIG. 3B illustrates a schematic representation of an exemplary test fixture that can be used to connect the 4-port DUT of FIG. 3A to a VNA.

A key premise is to invoke separability of a network describing one segment of the fixture. Here a fixture segment is defined to be a port pair (as is commonly done in the popular differential drive scenarios), but it can be expanded to larger port groupings if need be. FIG. 3B illustrates an exemplary fixture 300 that can be used to connect the 4-port DUT 302 to a VNA (not shown). FIG. 3B also shows that the fixture 300 is separated into (or treated as) two fixture segments $304_1$ and $304_2$. As use herein, the term "separate", "separated" or "separating" is not meant to indicate that the fixture is actually physically separated. Rather, these terms indicate that ports of the fixture are grouped together in such a way that each group of ports can be treated as a sub-fixture of the larger fixture.

When separating a test fixture (e.g., 300) into test fixture segments (e.g., $304_1$ and $304_2$), such separation is based on which ports of the DUT have internal coupling. This is useful, because two port pairing are very common, particularly for differential systems. Another assumption is the symmetry of the two fixture segments (e.g., $304_1$ and $304_2$). This symmetry assumption can including assuming that: $S_{13}^{fixture\_2}=S_{13}^{fixture\_1}$, $S_{23}^{fixture\_2}=S_{23}^{fixture\_1}$, $S_{14}^{fixture\_2}=S_{14}^{fixture\_1}$, $S_{24}^{fixture\_2}=S_{24}^{fixture\_1}$, $S_{31}^{fixture\_2}=S_{31}^{fixture\_1}$, $S_{41}^{fixture\_2}=S_{41}^{fixture\_1}$, $S_{32}^{fixture\_2}=S_{32}^{fixture\_1}$ and $S_{42}^{fixture\_2}=S_{42}^{fixture\_1}$.

Here, because each test fixture segment is a 4-port device, sixteen scattering parameters (S-parameters) can fully define each test fixture segment. However, for the most commonly used fixture structures, some simplifications can be made. Typically a launch onto the fixture itself (e.g., a connection from a coaxial connector onto a board medium of the fixture) is the most troublesome. For example, for fixture segment $304_1$, mismatch and coupling tend to be strongest on the outer plane of a fixture (e.g., where the fixture is connected to a coaxial connector), rather than the inner plane (where the fixture is connected to the DUT). Also, the link from the inner plane of the fixture to the DUT can often be done in a very well-controlled impedance environment with good ground definition. Thus, an assumption is to transfer all mismatch and cross-talk to the outer plane of the fixture. For example, referring to FIG. 3B, for fixture segment $304_1$ it is assumed that mismatch is concentrated at the 1-2 side, and that insubstantial mismatch occurs at the 3-4 side; and for fixture segment $304_2$ it is assumed that mismatch is concentrated at the 3-4 side, and that insubstantial mismatch occurs at the 1-2 side. As can be appreciated from FIG. 3B, here the 1-2 side of fixture segment $304_1$ is an outer plane; the 3-4 side of fixture segment $304_1$ is an inner plane; the 1-2 side of fixture segment $304_2$ is an inner plane; and the 3-4 side of fixture segment $304_2$ is an outer plane. It is also assumed that the crosstalk can be lumped at the outer planes. This assumption rests on the insertion loss of the fixture not being very high (because then from an S-parameter point of view, it doesn't matter where the cross-talk is concentrated).

It is also assumed that the mismatch even at the 1-2 side is minimal and insignificant, and that there is some insertion loss in the fixture. Both of these are reasonable assumptions, particularly for the popular printed circuit (PC) board-based fixture environment. It is also assumed that the amount of cross-talk is small relative to the insertion loss, which is also usually true for well-designed test fixtures.

With this assumption group, the S-parameters for the fixture segment $304_1$ simplify to that shown below, in Equation 1a (Eq. 1a). In other words, because there is assumed to be insignificant mismatch on the 3-4 side of the fixture segment $304_1$, and cross-talk is lumped at the 1-2 side, then it is reasonable to assume that $S_{33}$, $S_{34}$, $S_{34}$ and $S_{44}$ are all zero.

$$\begin{bmatrix} S_{11} & S_{12} & S_{13} & S_{14} \\ S_{21} & S_{22} & S_{23} & S_{24} \\ S_{31} & S_{32} & 0 & 0 \\ S_{41} & S_{42} & 0 & 0 \end{bmatrix} \quad \text{(Eq. 1a)}$$

Similarly, for the fixture segment $304_2$, because there is assumed to be insignificant mismatch and on the 1-2 side of the fixture segment $304_2$, and cross-talk is lumped at the 3-4 side, then it is reasonable to assume that $S_{11}$, $S_{21}$, $S_{12}$ and $S_{22}$ are all zero, as shown in Equation 1b (Eq. 1b).

$$\begin{bmatrix} 0 & 0 & S_{13} & S_{14} \\ 0 & 0 & S_{23} & S_{24} \\ S_{31} & S_{32} & S_{33} & S_{34} \\ S_{41} & S_{42} & S_{43} & S_{44} \end{bmatrix} \quad \text{(Eq. 1b)}$$

Figure 3C:
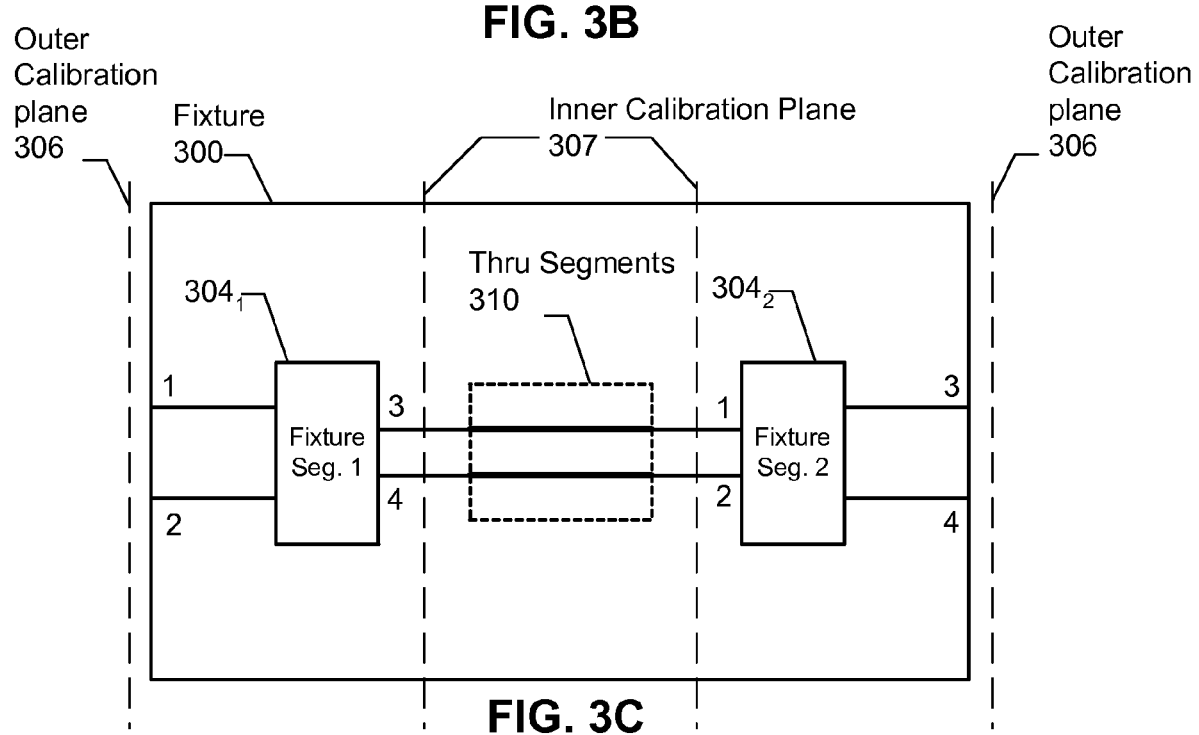
FIG. 3C illustrates how thru segments can be used with the test fixture of FIG. 3B to provide a test structure that can be connected to a VNA, for measuring the structure's S-parameters, in accordance with specific embodiments of the present invention.

To proceed further, there should be some sort of test structure that can be connected to a VNA, for measuring the structure's S-parameters. The simplest of all in a fixture environment is a thru system including the two fixture segments, with thru segments there-between, as shown in FIG. 3C. Each thru segment is a transmission line segment with good match, very low insertion loss relative to the rest of the structure, and known electrical length (in other words, perfect match, zero loss and zero electrical length is not necessary). The resulting test structure is, in some sense, a minimal calibration structure to get enough information about the fixture (under some assumptions) to allow for successful de-embedding. More specifically, a 4-port calibration is performed at outer planes of the two test fixture segments, while corresponding ports of the inner planes of the test fixture segments are connected together with thru segments, to thereby determine a set of S-parameters ($S_{mn}^{thru}$), sometimes referred to herein as a "thru" set.

Here the inner match assumption (i.e., relating to the 3-4 side of fixture segment $304_1$, and the 1-2 side of fixture segment $304_2$) stated above is met, and with proper construction the cross-talk assumption can also be met. With regards to test fixture segment $304_1$, from the 16 S-parameters measured of this structure, the upper left (UL) quadrant of Eq. 1a (i.e., $S_{11}$, $S_{21}$, $S_{12}$ and $S_{22}$) can be filled, since it is still assumed that what mismatch exists is primarily from the entry launch.

A next task can be to separate out the insertion loss and far-end crosstalk (FEXT) components of the two test fixture segments. Far-end crosstalk (FEXT) is defined as a measure of the unwanted signal coupling from a transmitter at the near-end into a neighboring pair measured at the far-end. Near-end crosstalk (NEXT) is defined as the unwanted signal coupling from a near-end transmitter into a pair measured at the same end.

Because it is desired to keep the standards measurement to this one thru construct, a symmetry assumption should be made with regards to insertion loss and FEXT. Thus in a simple two port case, one would conclude that Equation 2 (Eq. 2) is true.

$$S_{31}^{fixture} = \sqrt{S_{31}^{thru}} \quad \text{(Eq. 2)}$$

But with a 4-port (or larger) structure, it is no longer this simple. Consider the upper right quadrant (UR) of the S-matrix in Eq. 1a ($S_{13}$, $S_{23}$, $S_{14}$ and $S_{24}$) as if it represents the measurement of the thru structure. A naïve application of the two port approach might have one taking a square root of each term individually. Since the FEXT terms (e.g., $S_{23}$, $S_{32}$, $S_{14}$ and $S_{41}$) represent a leakage, they can fully cross-over and back to the main line transmission paths and reinforce each other. Thus a multiplicative combination is not correct. Consider a perfectly matched, lossless fixture pair with no NEXT (i.e., $S_{11}=S_{22}=S_{33}=S_{44}=S_{12}=S_{21}=S_{34}=S_{43}=0$, and $S_{31}=S_{13}=S_{42}=S_{24}=1$) but with some FEXT ($S_{32}=S_{23}=S_{41}=S_{14}=0.1$ on each segment). If one connects these two segments in the thru construct, one gets the result of FIG. 5.

Figure 5:
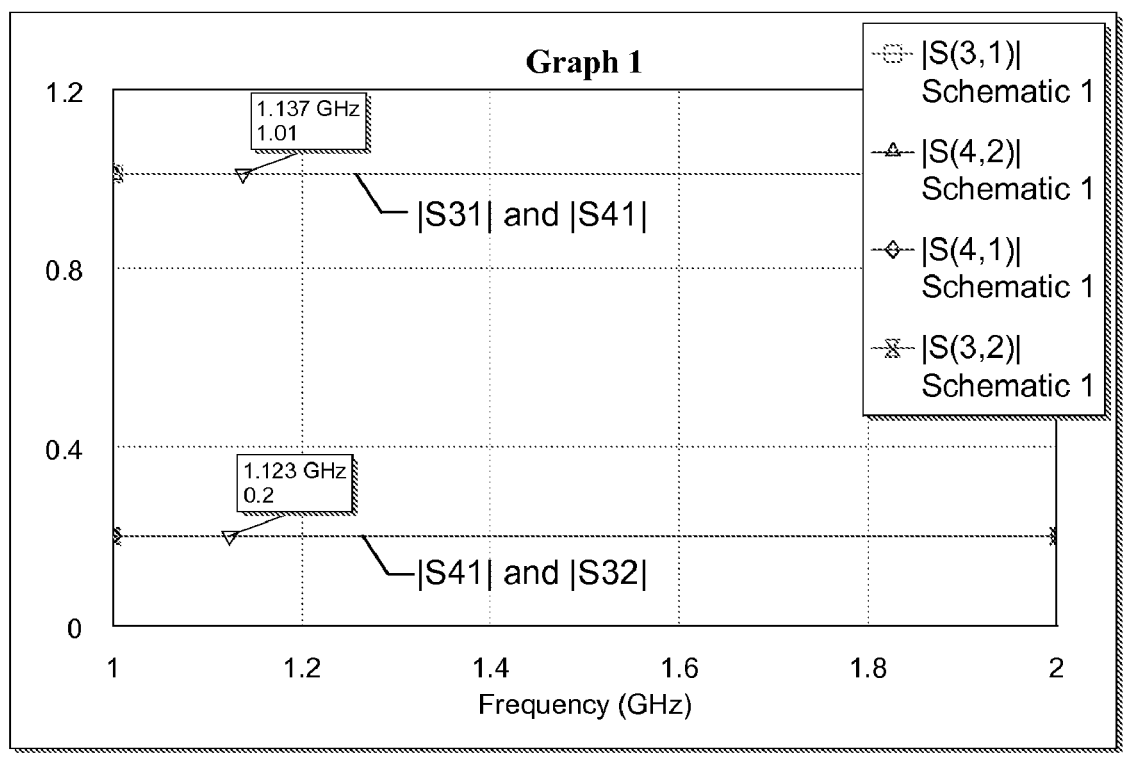
FIG. 5 illustrates how the use of a wrong equation will result in incorrect S-parameters.

More specifically, FIG. 5 shows the calculation of the two described fixture segments $308_1$ and $308_2$. If the paths could be treated as independent (i.e., calculated on a term-by-term basis), |S41| and |S32| should have been 0.01 instead of the shown 0.2, and |S31| and |S42| should have been 1 instead of 1.01. In other words, if the terms could have been calculated on a term-by-term basis, the net FEXT should have been 0.01 instead of the observed 0.2. This is the result of the term-by-term approach ignoring coherent combination.

It is possible to show through transfer matrix arithmetic, that the proper way to combine the quadrants is through a matrix square root operation, as shown below.

$$\begin{bmatrix} S_{13}^{fixture} & S_{14}^{fixture} \\ S_{23}^{fixture} & S_{24}^{fixture} \end{bmatrix} = \sqrt{\begin{bmatrix} S_{13}^{thru} & S_{14}^{thru} \\ S_{23}^{thru} & S_{24}^{thru} \end{bmatrix}} \quad \text{(Eq. 3a)}$$

Exemplary details of how to perform such a square root operation are provided, e.g., in an article by A. Bjorck and S. Hammarling, entitled "A Schur Method for the Square Root of a Matrix," Linear Algebra and Its Applications, Vol. 52/53, 1983, pp. 127-140, Elsevier Science Publishing, New York, N.Y., which is incorporated herein by reference.

Using Equation 3a, $S_{13}^{fixture\_1}$, $S_{14}^{fixture\_1}$, $S_{23}^{fixture\_1}$ and $S_{24}^{fixture\_1}$ can be solved for. In other words, Equation 3a enables the upper right (UR) quadrant of the S-matrix of Equation 1a to be determined.

The reciprocal structure applies to the lower left (LL) quadrant (i.e., $S_{31}$, $S_{41}$, $S_{32}$ and $S_{42}$) of the matrix, as shown below.

$$\begin{bmatrix} S_{31}^{fixture} & S_{32}^{fixture} \\ S_{41}^{fixture} & S_{42}^{fixture} \end{bmatrix} = \sqrt{\begin{bmatrix} S_{31}^{thru} & S_{32}^{thru} \\ S_{41}^{thru} & S_{42}^{thru} \end{bmatrix}} \quad \text{(Eq. 3b)}$$

The lower left (LL) quadrant S-parameters (i.e., $S_{31}$, $S_{41}$, $S_{32}$ and $S_{42}$) can be solved for using Equation 3b. Alternatively, using the assumption that the fixture segment is reciprocal, it can be assumed that the LL quadrant equals the reciprocal of UR quadrant. More specifically, it can be assumed that $S_{31}^{fixture\_1}=S_{13}^{fixture\_1}$, $S_{41}^{fixture\_1}=S_{14}^{fixture\_1}$, $S_{32}^{fixture\_1}=S_{23}^{fixture\_1}$, and $S_{42}^{fixture\_1}=S_{24}^{fixture\_1}$, where $S_{13}^{fixture\_1}$, $S_{14}^{fixture\_1}$, $S_{23}^{fixture\_1}$ and $S_{24}^{fixture\_1}$ were solved for using Equation 3a.

All that remains is to determine the S-parameters for the upper left (UL) quadrant (i.e., $S_{11}$, $S_{12}$, $S_{21}$ and $S_{22}$). From the previous assumptions about the sources of mismatch and NEXT, these terms would remain unchanged from the thru measurement. More specifically, the UL quadrant can be determined by assuming $S_{11}^{fixture\_1}=S_{11}^{thru}$, $S_{21}^{fixture\_1}=S_{21}^{thru}$, $S_{12}^{fixture\_1}=S_{12}^{thru}$ and $S_{22}^{fixture\_1}=S_{22}^{thru}$. Here, the $S_{11}^{thru}$, $S_{21}^{thru}$, $S_{12}^{thru}$ and $S_{22}^{thru}$ are the S-parameters measurements resulting from the 4-port calibration at outer planes of the two test fixture segments $304_1$ and $304_2$, while corresponding ports of the inner planes of the test fixture segments are connected together with thru segments 310.

Combining these results to get the estimated S-parameters of the two fixture segments, one gets the following where S~represents the quadrants $$S^{fixture\_1} = \begin{bmatrix} \tilde{S}_{UL}^{thru} & \sqrt{\tilde{S}_{UR}^{thru}} \\ \sqrt{\tilde{S}_{LL}^{thru}} & 0 \end{bmatrix} \quad \text{(Eq. 4)}$$

$$S^{fixture\_2} = \begin{bmatrix} 0 & \sqrt{\tilde{S}_{UR}^{thru}} \\ \sqrt{\tilde{S}_{LL}^{thru}} & \tilde{S}_{UL}^{thru} \end{bmatrix}$$

Here the port numbering may be a bit unconventional, in that ports 3 and 4 of fixture segment $308_1$ and ports 1 and 2 of fixture segment $308_2$ are nearest the DUT plane. Some caution is needed and port reversal may be required depending on the implementation of the de-embedding algorithm. The quadrant subscripts above are UL=upper left, UR=upper right, LL=lower left, and LR=lower right.

Figure 4:
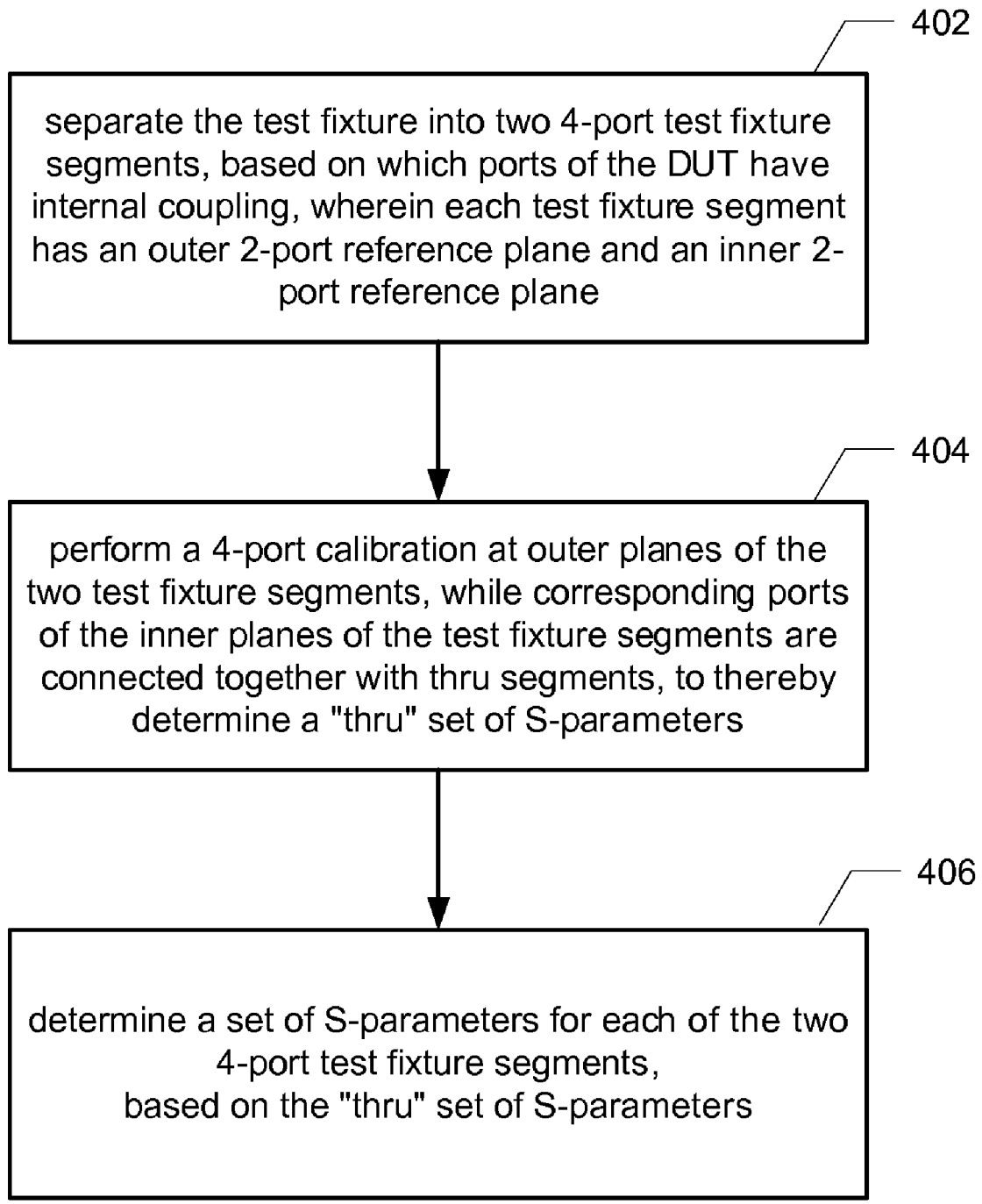
FIG. 4 is a high level flow diagram that summarizes a technique, according to specific embodiments of the present invention, that can be used to characterize a test fixture (e.g., of FIG. 3B) that is used for connecting a 4-port DUT (e.g., of FIG. 3A) to a VNA, to thereby enable de-embedding of the test fixture from measurements of the DUT connected to the test fixture.

The above described technique is summarized with reference to the high level flow diagram of FIG. 4. Such technique can be used to characterize a test fixture (e.g., 300) that is used for connecting a 4-port DUT (e.g., 302) to a VNA, to thereby enable de-embedding of the test fixture from measurements of the DUT connected to the test fixture. This technique can also be used for characterizing a test fixture that is for use in connecting a DUT having more than 4 ports to a VNA, but where only 4 ports of the test fixture are being characterized, and thus, only 4 port of the DUT are connected to the test fixture.

Referring to FIG. 4, at a step 402, the test fixture (e.g., 300) is separated into two 4-port test fixture segments (e.g., $304_1$ and $304_2$), based on which ports of the DUT have internal coupling, wherein each test fixture segment has an outer 2-port reference plane and an inner 2-port reference plane. For example, for a 4-port DUT having a pair of differential inputs, and a pair of differential outputs, the ports of the test fixture that connect to the differential inputs can be a first test fixture segment, and the ports of the test fixture that connect to the differential outputs can be a second test fixture segment.

Still referring to FIG. 4, at a step 404 a 4-port calibration is performed at outer planes of the two test fixture segments, while corresponding ports of the inner planes of the test fixture segments are connected together with thru segments, to thereby determine a thru set of S-parameters ($S_{mn}^{thru}$). An example of this is described above with reference to FIG. 3C.

Next, at a step 406, a set of S-parameters ($S_{mn}^{fixture\_1}$ and $S_{mn}^{fixture\_2}$) is determined for each of the two 4-port test fixture segments, based on the thru set of S-parameters ($S_{mn}^{thru}$) determined at step 404. Details of this step are provided above.

The results of step 406 is likely a de-embedding file for each test fixture. Once the S-parameters (which may be in the form of a de-embedding file) are determined for the test fixture segments, they can be used to de-embed the test fixture from measurements of a DUT that include measurements of the test fixture. Such de-embedding is well known, and thus need not be explained herein.

Figure 6:
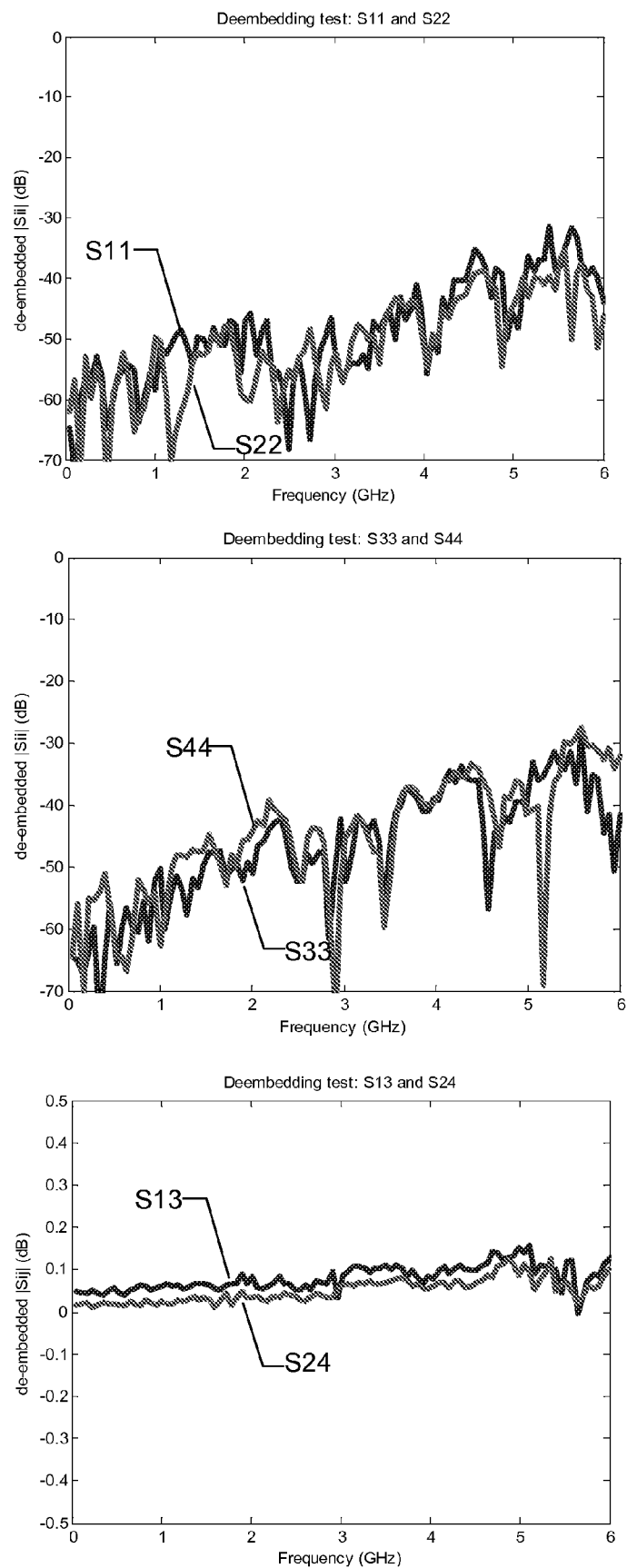
FIG. 6 show S11 and S22 (top graph), S33 and S44 (middle graph), and S13 and S24 (bottom graph) for a thru-structure DUT, where techniques of the present invention where used to characterize a test fixture used to connect the DUT to a VNA, and the test fixture was de-embedded from measurements of the DUT connected to the test fixture.

To test the above described concepts, a printed circuit board (PCB) test fixture was used with a total of 18 ports, but it will be treated as a four port structure for this example. A thru line calibration structure, as described above, was provided on the board. This structure was measured, and de-embedding files were generated using the technique described. Such de-embedding files will typically be saved as s4p files. These two s4p files were then de-embedded from another thru measurement to see if the files generated could delete the fixture (leaving a perfectly matched, lossless network). The results of the de-embedding of the two computed fixture segments are shown in FIG. 6.

Figure 7:
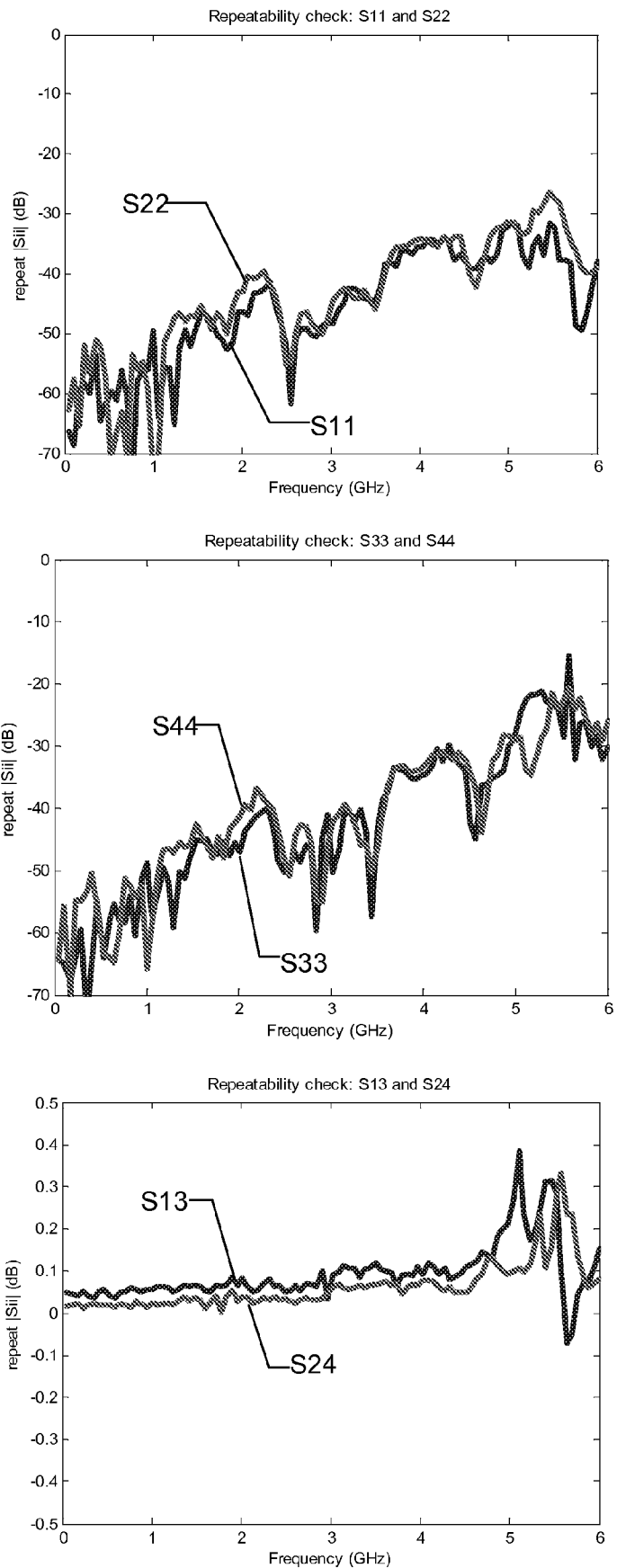
FIG. 7 shows results of a repeatability check of the results shown in FIG. 6.

Ideally the results would show perfect match and no net insertion loss. These results are reasonably within expectations of repeatability of the cables involved. To check this, the thru structure was measured twice and the pure repeatability of the measurement was checked (in a quasi-normalization process). These results are shown in FIG. 7 and are even worse. While this is likely due to a cable bump that happened during that experiment, it does suggest that the de-embedding experiment of FIG. 6 was successful to within expectations.

Figure 8:
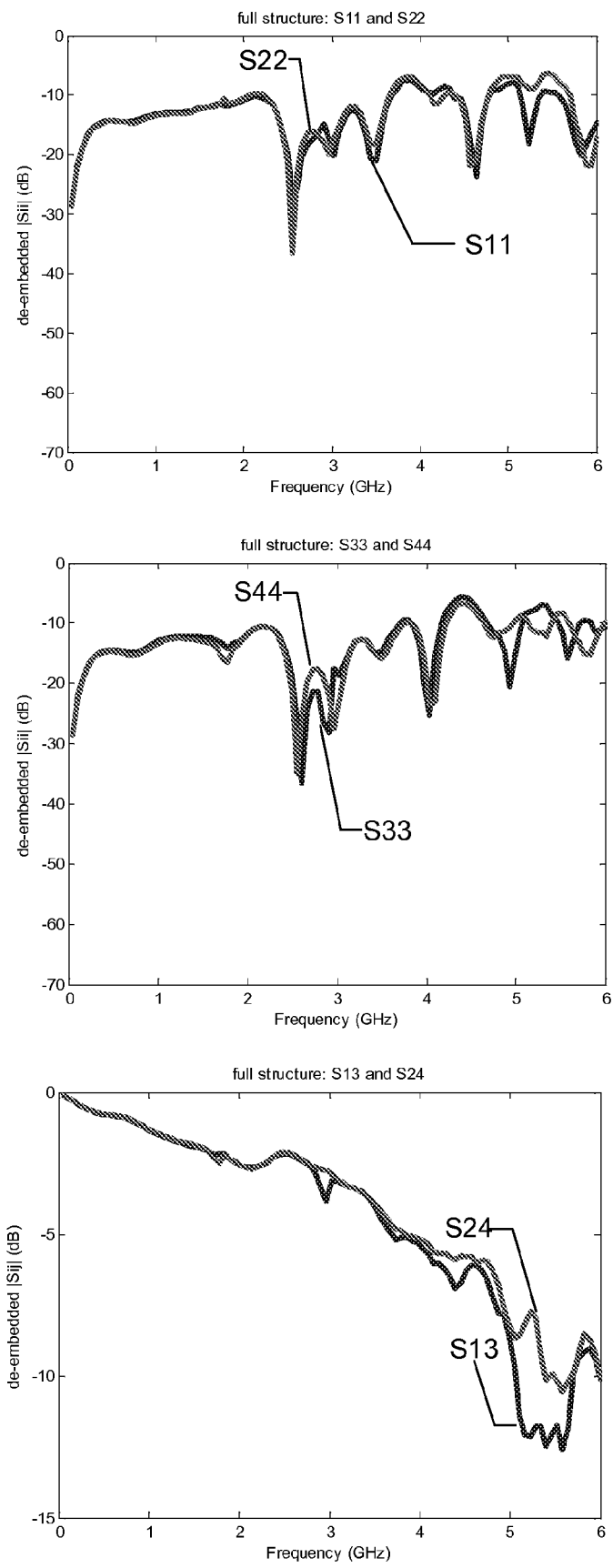
FIG. 8 shows the same S-parameters as shown in FIGS. 6 and 7, but for one of the fixture segments, to give an idea of the magnitude of the structure being de-embedded.

As an indication of the scale of attenuation and mismatch that is being removed, some of the S-parameters of the full thru-pair structure are shown in FIG. 8. More specifically, FIG. 8 shows measured S-parameters for one of the test fixture segments 304, to give an idea of the magnitude of the structure being de-embedded. Match was on the scale of −10 dB and insertion loss reached ~13 dB at 6 GHz.

Provided above is a method for extracting parameters of multiport fixtures and other structures for de-embedding. In contrast to previous multiport techniques, it is amenable to situations when few calibration standards are available at the DUT measurement plane, because only a thru pair structure is required. In contrast to simpler 2 port techniques, it properly handles FEXT (far end cross-talk) contributions in the fixture, thus improving accuracy at least in low leakage situations. The method relies on a few assumptions: symmetric insertion loss between fixture sections (and two fixture sections can be connected together), well-matched DUT plane interfaces, and mismatch and NEXT dominated by the fixture launch.

Embodiments of the present invention can also be used to characterize a test fixture that is used for connecting only 2 ports of a DUT to a VNA. This would be useful where a fixture is being used to measure S-parameters of a 2-port DUT. This would also be useful where there is a desire to only measure S-parameters of 2 ports of a DUT having more than 2 ports, e.g., because only 2 ports have coupling. More generally, specific embodiments of the present invention can be used to characterize a test fixture that is used for connecting 2 ports of DUT to a VNA, to thereby enable de-embedding of the test fixture from measurements of the DUT connected to the test fixture.

If the test fixture that is being characterized is similar to test fixture 300, and is capable of being separated into two 4-port test fixture segments, then the technique described above with reference to FIGS. 3B, 3C and 4 can be used. The only difference is that since only 2 ports of the DUT will be connected to the test fixture during actual measurements of the DUT, then only the test fixture segment that will be connected to the DUT need be fully characterized (at step 406). For example, there may only be the need to determine $S_{mn}^{fixture\_1}$, but not $S_{mn}^{fixture\_2}$. This will result in a reduced amount of calculations.

Where the test fixture is only a 2-port test fixture, then two such test fixtures can be connected together with thru segments (similar to 310), to enable the 4-port calibration of step 404 to be performed. Each 2-port test fixture can be treated as a test fixture segment, and the technique described above with reference to FIGS. 3B, 3C and 4 can be used. For similar reasons to those just mentioned, after the 4-port calibration is performed at step 404, only one test fixture segment need be characterized at step 406.

Figure 9A:
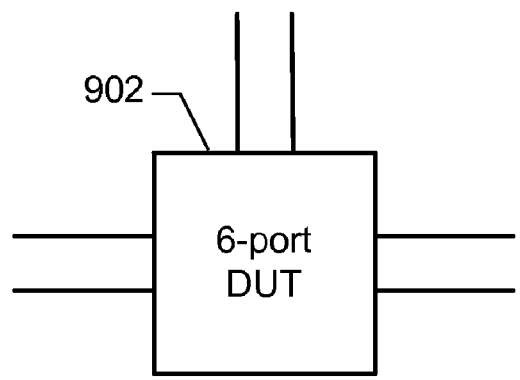
FIG. 9A illustrates a schematic representation of an exemplary 6-port DUT.
Figure 9B:
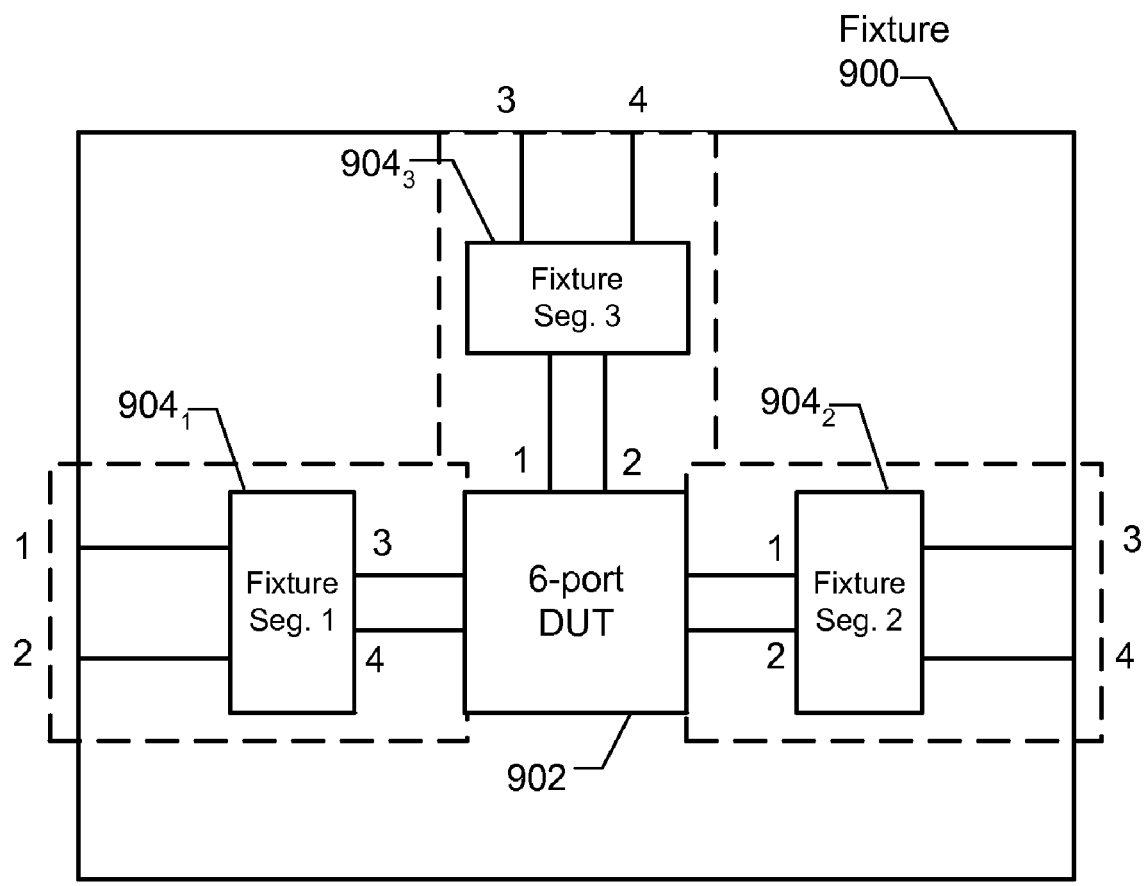
FIG. 9B illustrates a schematic representation of an exemplary test fixture that can be used to connect the 6-port DUT of FIG. 9A to a VNA.

Embodiments of the present invention can also be used to characterize a test fixture that is used for connecting a DUT having more than 4 ports to a VNA. For example, FIG. 9A illustrates a schematic representation of a 6-port DUT 902. FIG. 9B illustrates a schematic representation of a fixture 900 that can be used to connect the 6-port DUT to a VNA.

To characterize a test fixture, such as fixture 900, the test fixture is separated into multiple 4-port test fixture segments, based on which port pairs of the DUT have internal coupling. Each test fixture segment has an outer 2-port reference plane and an inner 2-port reference plane. For the fixture 900, which has 6 ports, this can result in three 4-port test fixture segments 904$_1$, 904$_2$ and 904$_3$, as shown in FIG. 9B.

Figure 9C:
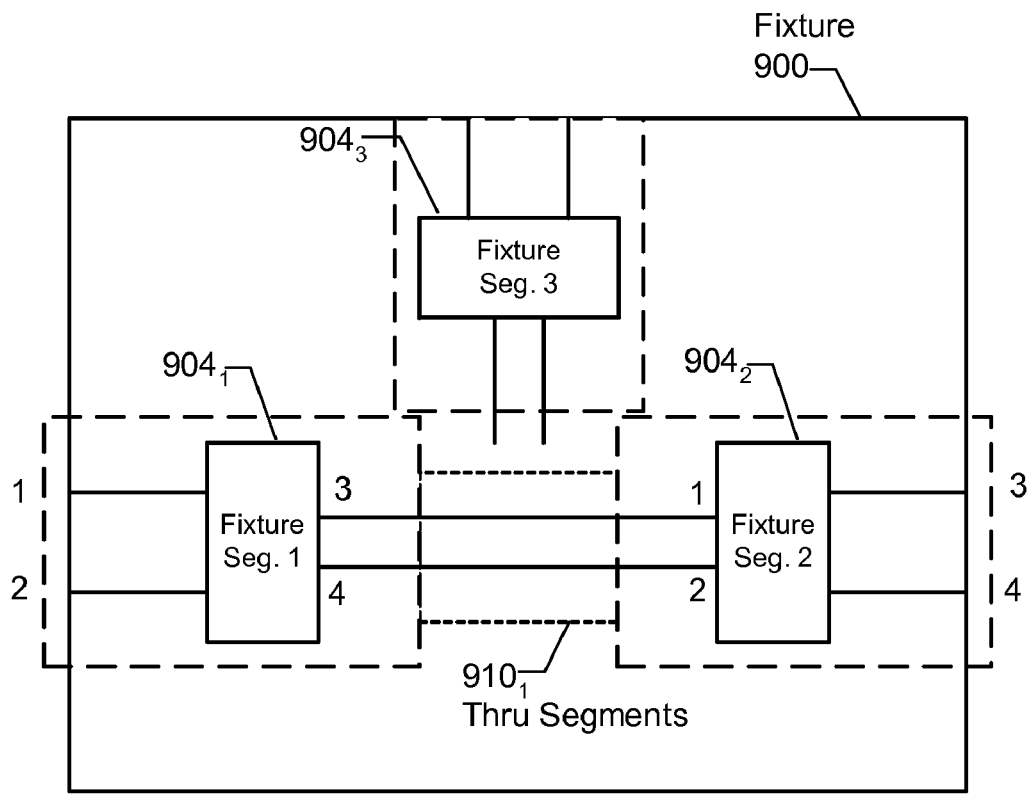
FIGS. 9C and 9D illustrates how thru segments can be used with the test fixture of FIG. 9B to provide test structures that can be connected to a VNA, for measuring the structure's S-parameters, in accordance with specific embodiments of the present invention.
Figure 9D:
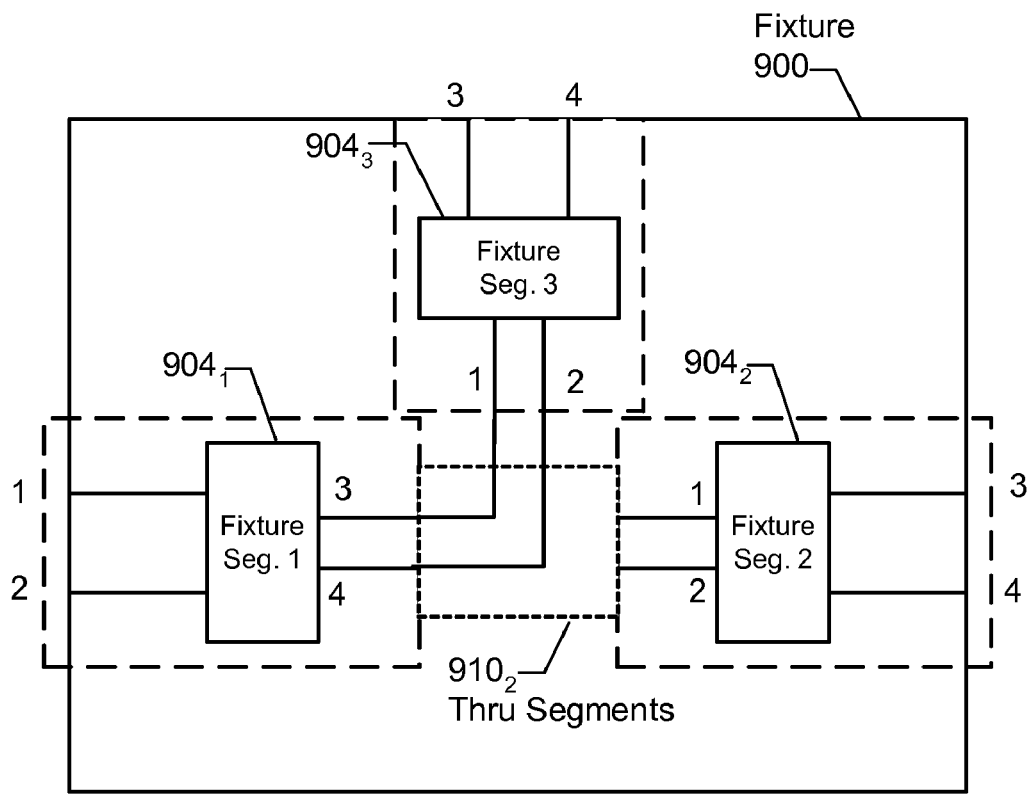

As shown in FIG. 9C, next, in a similar manner as was done at step 404 discussed above, a 4-port calibration is performed at outer planes of a pair of the test fixture segments (e.g., 904$_1$ and 904$_2$), while corresponding ports of the inner planes of the pair of test fixture segments are connected together with thru segments (e.g., 910$_1$), to thereby determine a thru set of S-parameters ($S_{mn}^{thru\_x}$). This is repeated for further pairs of the test fixture segments (e.g., 904$_1$ and 904$_3$, as shown in FIG. 9D), until all of the test fixtures segments are part of at least one 4-port calibration. Each time this step is repeated, different thru segments (e.g., 910$_2$) may be used, if necessary. Also, each time this step is repeated, another thru set of S-parameters is determined.

Next, in a similar manner as was done at step 406 discussed above, a set of S-parameters ($S_{mn}^{fixture\_y}$) is determined for each of the multiple 4-port test fixture segments, based on the thru sets of S-parameters determined.

Overall, the just described techniques of the present invention enable the characterizing of a test fixture that is used for connecting a DUT to a VNA, to thereby enable de-embedding of the test fixture from measurements of the DUT connected to the test fixture. Since embodiments of the present invention generally characterize a fixture, embodiments of the present invention can also be used for embedding. Embodiments of the present invention can also be used to enable de-embedding of one fixture, and embedding of another fixture that may have a matching network, artificial loading network, or some other construct.

Many features of the present invention can be performed in, using, or with the assistance of hardware, software, firmware, or combinations thereof. Consequently, features of the present invention may be implemented using a processing system (e.g., including one or more processors). Such a processing system can be implanted, e.g., within a Vector Network Analyzer (VNA), or a computer connected to a VNA, or the like.

Features of the present invention can be implemented in, using, or with the assistance of a computer program product which is a storage medium (media) having instructions stored thereon/in which can be used to program a processing system to perform any of the features presented herein. The storage medium can include, but is not limited to ROMs, RAMs, EPROMs, EEPROMs, DRAMs, VRAMs, flash memory devices, or any type of media or device suitable for storing instructions and/or data.

Stored on any one of the machine readable medium (media), features of the present invention can be incorporated in software and/or firmware for controlling the hardware of a processing system, and for enabling a processing system to interact with other mechanism utilizing the results of the present invention. Such software or firmware may include, but is not limited to, application code, device drivers, operating systems and execution environments/containers.

Features of the invention may also be implemented in hardware using, for example, hardware components such as application specific integrated circuits (ASICs). Implementation of the hardware state machine so as to perform the functions described herein will be apparent to persons skilled in the relevant art(s).

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks illustrating the performance of specified functions and relationships thereof. The boundaries of these functional building blocks have often been arbitrarily defined herein for the convenience of the description. Alternate boundaries can be defined so long as the specified functions and relationships thereof are appropriately performed. Any such alternate boundaries are thus within the scope and spirit of the invention.

The breadth and scope of the present invention should not be limited by any of the above-described exemplary embodiments.

What is claimed is:

1. A method for characterizing a test fixture that is used for connecting 4 ports of a device under test (DUT) to a vector network analyzer (VNA), to thereby enable de-embedding of the test fixture from measurements of the DUT connected to the test fixture, the method comprising:

(a) separating the test fixture into two 4-port test fixture segments, based on which ports of the DUT have internal coupling, wherein each test fixture segment has an outer 2-port reference plane and an inner 2-port reference plane;

(b) performing a 4-port calibration at outer planes of the two test fixture segments, while corresponding ports of the inner planes of the test fixture segments are connected together with thru segments, to thereby determine a first set of S-parameters ($S_{mn}^{thru}$); and (c) determining a set of S-parameters ($S_{mn}^{fixture\_1}$ and $S_{mn}^{fixture\_2}$) for each of the two 4-port test fixture segments, based on the first set of S-parameters ($S_{mn}^{thru}$).

2. The method of claim 1, wherein step (c), includes, determining the S-parameters ($S_{mn}^{fixture\_1}$) for one of the two test fixture segments by:

(c.1) assuming $S_{11}^{fixture\_1}=S_{11}^{thru}$, $S_{21}^{fixture\_1}=S_{21}^{thru}$, $S_{12}^{fixture\_1}=S_{12}^{thru}$ and $S_{22}^{fixture\_1}=S_{22}^{thru}$, where $S_{11}^{thru}$, $S_{21}^{thru}$, $S_{12}^{thru}$ and $S_{22}^{thru}$ were determined at step (b);

c.2) solving for $S_{13}^{fixture\_1}$, $S_{23}^{fixture\_1}$, $S_{14}^{fixture\_1}$ and $S_{24}^{fixture\_1}$ assuming $$\begin{bmatrix} S_{13}^{fixture\_1} & S_{14}^{fixture\_1} \\ S_{23}^{fixture\_1} & S_{24}^{fixture\_1} \end{bmatrix} = \sqrt{\begin{bmatrix} S_{13}^{thru} & S_{14}^{thru} \\ S_{23}^{thru} & S_{24}^{thru} \end{bmatrix}},$$

where $S_{13}^{thru}$, $S_{23}^{thru}$, $S_{14}^{thru}$ and $S_{23}^{thru}$ were determined at step (b);

(c.3) solving for $S_{31}^{fixture\_1}$, $S_{41}^{fixture\_1}$, $S_{32}^{fixture\_1}$ and $S_{42}^{fixture\_1}$ assuming $$\begin{bmatrix} S_{31}^{fixture\_1} & S_{32}^{fixture\_1} \\ S_{41}^{fixture\_1} & S_{42}^{fixture\_1} \end{bmatrix} = \sqrt{\begin{bmatrix} S_{31}^{thru} & S_{32}^{thru} \\ S_{41}^{thru} & S_{42}^{thru} \end{bmatrix}},$$

where $S_{31}^{thru}$, $S_{41}^{thru}$, $S_{32}^{thru}$ and $S_{42}^{thru}$ were determined at step (b); and (c.4) assuming $S_{33}^{fixture\_1}$, $S_{34}^{fixture\_1}$, $S_{43}^{fixture\_1}$, and $S_{44}^{fixture\_1}$ are each equal to zero.

3. The method of claim 2, wherein step (c) includes, determining the S-parameters ($S_{mn}^{fixture\_2}$) for the other one of the two test fixture segment segments by:

(c.5) assuming $S_{11}^{fixture\_2}$, $S_{21}^{fixture\_2}$, $S_{12}^{fixture\_2}$ and $S_{22}^{fixture\_2}$ are each equal to zero;

(c.6) assuming $S_{13}^{fixture\_2}=S_{13}^{fixture\_1}$, $S_{23}^{fixture\_2}=S_{23}^{fixture\_1}$, $S_{14}^{fixture\_2}=S_{14}^{fixture\_1}$, and $S_{24}^{fixture\_2}=S_{42}^{fixture\_1}$,
where $S_{13}^{fixture\_1}$, $S_{14}^{fixture\_1}$, $S_{23}^{fixture\_1}$ and $S_{24}^{fixture\_1}$ were determined at step (c.2);

(c.7) assuming $S_{31}^{fixture\_2}=S_{31}^{fixture\_1}$, $S_{41}^{fixture\_2}=S_{41}^{fixture\_1}$, $S_{32}^{fixture\_2}=S_{32}^{fixture\_1}$ and $S_{42}^{fixture\_2}=S_{42}^{fixture\_1}$,
where $S_{31}^{fixture\_1}$, $S_{32}^{fixture\_1}$, $S_{41}^{fixture\_1}$ and $S_{42}^{fixture\_1}$ were determined at step (c.3); and (c.8) assuming $S_{33}^{fixture\_2}=S_{33}^{thru}$, $S_{43}^{fixture\_2}=S_{43}^{thru}$, $S_{34}^{fixture\_2}=S_{34}^{thru}$ and $S_{44}^{fixture\_2}=S_{44}^{thru}$,
where $S_{33}^{thru}$, $S_{43}^{thru}$, $S_{34}^{thru}$, and $S_{44}^{thru}$ were determined at step (b).

4. The method of claim 2, wherein step (c) includes, determining the S-parameters ($S_{mn}^{fixture\_2}$) for the other one of the two test fixture segment segments by:

(c.5) assuming $S_{11}^{fixture\_2}$, $S_{21}^{fixture\_2}$, $S_{12}^{fixture\_2}$ and $S_{22}^{fixture\_2}$ are each equal to zero;

(c.6) solving for $S_{13}^{fixture\_2}$, $S_{23}^{fixture\_2}$, $S_{14}^{fixture\_2}$ and $S_{24}^{fixture\_2}$ assuming $$\begin{bmatrix} S_{13}^{fixture\_2} & S_{14}^{fixture\_2} \\ S_{23}^{fixture\_2} & S_{24}^{fixture\_2} \end{bmatrix} = \sqrt{\begin{bmatrix} S_{13}^{thru} & S_{14}^{thru} \\ S_{23}^{thru} & S_{24}^{thru} \end{bmatrix}},$$

where $S_{13}^{thru}$, $S_{23}^{thru}$, $S_{14}^{thru}$ and $S_{23}^{thru}$ were determined at step (b);

(c.7) solving for $S_{31}^{fixture\_2}$, $S_{41}^{fixture\_2}$, $S_{32}^{fixture\_2}$ and $S_{42}^{fixture\_2}$ assuming $$\begin{bmatrix} S_{31}^{fixture\_2} & S_{32}^{fixture\_2} \\ S_{41}^{fixture\_2} & S_{42}^{fixture\_2} \end{bmatrix} = \sqrt{\begin{bmatrix} S_{31}^{thru} & S_{32}^{thru} \\ S_{41}^{thru} & S_{42}^{thru} \end{bmatrix}},$$

where $S_{31}^{thru}$, $S_{41}^{thru}$, $S_{32}^{thru}$ and $S_{42}^{thru}$ were determined at step (b); and (c.8) assuming $S_{33}^{fixture\_2}=S_{33}^{thru}$, $S_{43}^{fixture\_2}=S_{43}^{thru}$, $S_{34}^{fixture\_2}=S_{34}^{thru}$ and $S_{44}^{fixture\_2}=S_{44}^{thru}$,
where $S_{33}^{thru}$, $S_{43}^{thru}$, $S_{34}^{thru}$ and $S_{44}^{thru}$ were determined at step (b).

5. A method for characterizing a test fixture that is used for connecting 2 ports of a device under test (DUT) to a vector network analyzer (VNA), to thereby enable de-embedding of the test fixture from measurements of the DUT connected to the test fixture, the method comprising:

(a) performing a 4-port calibration at outer planes of the two 4-port test fixture segments, while corresponding ports of the inner planes of the two test fixture segments are connected together with thru segments, to thereby determine a first set of S-parameters ($S_{mn}^{thru}$), where one of the two test fixture segments is used for connecting 2 ports of a DUT to a VNA; and (b) determining a set of S-parameters ($S_{mn}^{fixture\_1}$) for the one of the two test fixture segments that is used for connecting 2 ports of a DUT to a VNA, based on the first set of S-parameters ($S_{mn}^{thru}$).

6. The method of claim 5, wherein step (c), includes, determining the S-parameters ($S_{mn}^{fixture\_1}$) for the one of the two test fixture segments used for connecting 2 ports of a DUT to a VNA by:

(c.1) assuming $S_{11}^{fixture\_1}=S_{11}^{thru}$, $S_{21}^{fixture\_1}=S_{21}^{thru}$, $S_{12}^{fixture\_1}=S_{12}^{thru}$ and $S_{22}^{fixture\_1}=S_{22}^{thru}$, where $S_{11}^{thru}$, $S_{21}^{thru}$, $S_{12}^{thru}$ and $S_{22}^{thru}$ were determined at step (b);

(c.2) solving for $S_{13}^{fixture\_1}$, $S_{23}^{fixture\_1}$, $S_{14}^{fixture\_1}$ and $S_{24}^{fixture\_1}$ assuming $$\begin{bmatrix} S_{13}^{fixture\_1} & S_{14}^{fixture\_1} \\ S_{23}^{fixture\_1} & S_{24}^{fixture\_1} \end{bmatrix} = \sqrt{\begin{bmatrix} S_{13}^{thru} & S_{14}^{thru} \\ S_{23}^{thru} & S_{24}^{thru} \end{bmatrix}},$$

where $S_{13}^{thru}$, $S_{23}^{thru}$, $S_{14}^{thru}$, and $S_{23}^{thru}$ were determined at step (b);

(c.3) solving for $S_{31}^{fixture\_1}$, $S_{41}^{fixture\_1}$, $S_{32}^{fixture\_1}$ and $S_{42}^{fixture\_1}$ assuming $$\begin{bmatrix} S_{31}^{fixture\_1} & S_{32}^{fixture\_1} \\ S_{41}^{fixture\_1} & S_{42}^{fixture\_1} \end{bmatrix} = \sqrt{\begin{bmatrix} S_{31}^{thru} & S_{32}^{thru} \\ S_{41}^{thru} & S_{42}^{thru} \end{bmatrix}},$$

where $S_{31}^{thru}$, $S_{41}^{thru}$, $S_{32}^{thru}$ and $S_{42}^{thru}$ were determined at step (b); and (c.4) assuming $S_{33}^{fixture\_1}$, $S_{34}^{fixture\_1}$, $S_{43}^{fixture\_1}$ and $S_{44}^{fixture\_1}$ are each equal to zero.

7. The method of claim 5, wherein step (c), includes, determining the S-parameters ($S_{mn}^{fixture\_1}$) for one of the two test fixture segments by:
 (c.1) assuming $S_{11}^{fixture\_1} = S_{11}^{thru}$, $S_{21}^{fixture\_1} = S_{21}^{thru}$, $S_{12}^{fixture\_1} = S_{12}^{thru}$ and $S_{22}^{fixture\_1} = S_{22}^{thru}$, where $S_{11}^{thru}$, $S_{21}^{thru}$, $S_{12}^{thru}$ and $S_{22}^{thru}$ were determined at step (b);
 (c.2) solving for $S_{13}^{fixture\_1}$, $S_{23}^{fixture\_1}$, $S_{14}^{fixture\_1}$ and $S_{24}^{fixture\_1}$ assuming $$\begin{bmatrix} S_{13}^{fixture\_1} & S_{14}^{fixture\_1} \\ S_{23}^{fixture\_1} & S_{24}^{fixture\_1} \end{bmatrix} = \sqrt{\begin{bmatrix} S_{13}^{thru} & S_{14}^{thru} \\ S_{23}^{thru} & S_{24}^{thru} \end{bmatrix}},$$

where $S_{13}^{thru}$, $S_{23}^{thru}$, $S_{14}^{thru}$ and $S_{23}^{thru}$ were determined at step (b);
 (c.3) assuming $S_{31}^{fixture\_1} = S_{13}^{fixture\_1}$, $S_{41}^{fixture\_1} = S_{14}^{fixture\_1}$, $S_{32}^{fixture\_1} = S_{23}^{fixture\_1}$ and $S_{42}^{fixture\_1} = S_{24}^{fixture\_1}$,
 where $S_{13}^{fixture\_1}$, $S_{14}^{fixture\_1}$, $S_{23}^{fixture\_1}$ and $S_{24}^{fixture\_1}$ were determined at step (c.2); and
 (c.4) assuming $S_{33}^{fixture\_1}$, $S_{34}^{fixture\_1}$, $S_{43}^{fixture\_1}$ and $S_{44}^{fixture\_1}$ each equal to zero.

8. The method of claim 5, wherein the two 4-port test fixture segments are parts of a same test fixture that are separated into the two 4-port test fixture segments, wherein each test fixture segment has an outer 2-port reference plane and an inner 2-port reference plane.

9. The method of claim 5, wherein the two 4-port test fixture segments are two physically distinct test fixtures, each having an outer 2-port reference plane and an inner 2-port reference plane.

10. The method of claim 1, wherein step (c), includes, determining the S-parameters ($S_{mn}^{fixture\_1}$) for one of the two test fixture segments by:
 (c.1) assuming $S_{11}^{fixture\_1} = S_{11}^{thru}$, $S_{21}^{fixture\_1} = S_{21}^{thru}$, $S_{12}^{fixture\_1} = S_{12}^{thru}$ and $S_{22}^{fixture\_1} = S_{22}^{thru}$, where $S_{11}^{thru}$, $S_{21}^{thru}$, $S_{12}^{thru}$ and $S_{22}^{thru}$ were determined at step (b);
 (c.2) solving for $S_{13}^{fixture\_1}$, $S_{23}^{fixture\_1}$, $S_{14}^{fixture\_1}$ and $S_{24}^{fixture\_1}$ assuming $$\begin{bmatrix} S_{13}^{fixture\_1} & S_{14}^{fixture\_1} \\ S_{23}^{fixture\_1} & S_{24}^{fixture\_1} \end{bmatrix} = \sqrt{\begin{bmatrix} S_{13}^{thru} & S_{14}^{thru} \\ S_{23}^{thru} & S_{24}^{thru} \end{bmatrix}},$$

where $S_{13}^{thru}$, $S_{23}^{thru}$, $S_{14}^{thru}$ and $S_{23}^{thru}$ were determined at step (b);
 (c.3) assuming $S_{31}^{fixture\_1} = S_{13}^{fixture\_1}$, $S_{41}^{fixture\_1} = S_{14}^{fixture\_1}$, $S_{32}^{fixture\_1} = S_{23}^{fixture\_1}$ and $S_{42}^{fixture\_1} = S_{24}^{fixture\_1}$,
 where $S_{13}^{fixture\_1}$, $S_{14}^{fixture\_1}$, $S_{23}^{fixture\_1}$ and $S_{24}^{fixture\_1}$ were determined at step (c.2); and
 (c.4) assuming $S_{33}^{fixture\_1}$, $S_{34}^{fixture\_1}$, $S_{43}^{fixture\_1}$ and $S_{44}^{fixture\_1}$ are each equal to zero.

11. The method of claim 10, wherein step (c) includes, determining the S-parameters ($S_{mn}^{fixture\_2}$) for the other one of the two test fixture segment segments by:
 (c.5) assuming $S_{11}^{fixture\_2}$, $S_{21}^{fixture\_2}$, $S_{12}^{fixture\_2}$ and $S_{22}^{fixture\_2}$ are each equal to zero;
 (c.6) assuming $S_{13}^{fixture\_2} = S_{13}^{fixture\_1}$, $S_{23}^{fixture\_2} = S_{23}^{fixture\_1}$, $S_{14}^{fixture\_2} = S_{14}^{fixture\_1}$ and $S_{24}^{fixture\_2} = S_{24}^{fixture\_1}$, where $S_{13}^{fixture\_1}$, $S_{14}^{fixture\_1}$, $S_{23}^{fixture\_1}$ and $S_{24}^{fixture\_1}$ were determined at step (c.2);
 (c.7) assuming $S_{31}^{fixture\_2} = S_{31}^{fixture\_1}$, $S_{41}^{fixture\_2} = S_{41}^{fixture\_1}$, $S_{32}^{fixture\_2} = S_{32}^{fixture\_1}$ and $S_{42}^{fixture\_2} = S_{42}^{fixture\_1}$,
where $S_{31}^{fixture\_1}$, $S_{32}^{fixture\_1}$, $S_{41}^{fixture\_1}$ and $S_{42}^{fixture\_1}$ were determined at step (c.3); and
 (c.8) assuming $S_{33}^{fixture\_2} = S_{33}^{thru}$, $S_{43}^{fixture\_2} = S_{43}^{thru}$, $S_{34}^{fixture\_2} = S_{34}^{thru}$ and $S_{44}^{fixture\_2} = S_{44}^{thru}$,
where $S_{33}^{thru}$, $S_{43}^{thru}$, $S_{34}^{thru}$ and $S_{44}^{thru}$ were determined at step (b).

12. The method of claim 10, wherein step (c) includes, determining the S-parameters ($S_{mn}^{fixture\_2}$) for the other one of the two test fixture segment segments by:
 (c.5) assuming $S_{11}^{fixture\_2}$, $S_{21}^{fixture\_2}$, $S_{12}^{fixture\_2}$ and $S_{22}^{fixture\_2}$ are each equal to zero;
 (c.6) solving for $S_{13}^{fixture\_2}$, $S_{23}^{fixture\_2}$, $S_{14}^{fixture\_2}$ and $S_{24}^{fixture\_2}$ assuming $$\begin{bmatrix} S_{13}^{fixture\_2} & S_{14}^{fixture\_2} \\ S_{23}^{fixture\_2} & S_{24}^{fixture\_2} \end{bmatrix} = \sqrt{\begin{bmatrix} S_{13}^{thru} & S_{14}^{thru} \\ S_{23}^{thru} & S_{24}^{thru} \end{bmatrix}},$$

where $S_{13}^{thru}$, $S_{23}^{thru}$, $S_{14}^{thru}$ and $S_{23}^{thru}$ were determined at step (b);
 (c.7) solving for $S_{31}^{fixture\_2}$, $S_{41}^{fixture\_2}$, $S_{32}^{fixture\_2}$ and $S_{42}^{fixture\_2}$ assuming $$\begin{bmatrix} S_{31}^{fixture\_2} & S_{32}^{fixture\_2} \\ S_{41}^{fixture\_2} & S_{42}^{fixture\_2} \end{bmatrix} = \sqrt{\begin{bmatrix} S_{31}^{thru} & S_{32}^{thru} \\ S_{41}^{thru} & S_{42}^{thru} \end{bmatrix}},$$

where $S_{31}^{thru}$, $S_{41}^{thru}$, $S_{32}^{thru}$ and $S_{42}^{thru}$ were determined at step (b); and
 (c.8) assuming $S_{33}^{fixture\_2} = S_{33}^{thru}$, $S_{43}^{fixture\_2} = S_{43}^{thru}$, $S_{34}^{fixture\_2} = S_{34}^{thru}$, and $S_{44}^{fixture\_2} = S_{44}^{thru}$,
where $S_{33}^{thru}$, $S_{43}^{thru}$, $S_{34}^{thru}$ and $S_{44}^{thru}$ were determined at step (b).

13. The method of claim 1, wherein the assumptions of step (c) rely on the following underlying assumptions:
 mismatch that occurs in one of the test fixture segments primarily occurs at the 1-2 side, rather than the 3-4 side;
 mismatch that occurs in the other one of the test fixture segments primarily occurs at the 3-4 side, rather than the 1-2 side; and
 the two test fixture segments have symmetrical transmission characteristics.

14. A method for characterizing a test fixture that is used for connecting a N-port device under test (DUT) to a vector network analyzer (VNA), to thereby enable de-embedding of the test fixture from measurements of the DUT connected to the test fixture, where N≧4, the method comprising:
 (a) separating the test fixture into multiple 4-port test fixture segments, based on which ports of the DUT have internal coupling, wherein each test fixture segment has an outer 2-port reference plane and an inner 2-port reference plane;
 (b) performing a 4-port calibration at outer planes of a pair of the test fixture segments, while corresponding ports of the inner planes of the pair of test fixture segments are connected together with thru segments, to thereby determine a thru set of S-parameters ($S_{mn}^{thru\_x}$);

(c) repeating step (b) for further pairs of the test fixture segments, until all of the test fixtures segments are part of at least one 4-port calibration, wherein each time step (b) is repeated another thru set of S-parameters is determined; and (d) determining a set of S-parameters ($S_{mn}^{fixture\_y}$) for each of the multiple 4-port test fixture segments, based on the thru sets of S-parameters determined at steps (b) and (c).

\* \* \* \* \*